United States Patent [19]

Tokura et al.

[11] Patent Number: 4,471,315
[45] Date of Patent: Sep. 11, 1984

[54] DIFFERENTIAL AMPLIFIER CIRCUIT

[75] Inventors: Norihito Tokura, Okazaki; Hisasi Kawai, Toyohashi; Tsuneyuki Egami, Aichi, all of Japan

[73] Assignee: Nippon Soken, Inc., Nishio, Japan

[21] Appl. No.: 301,747

[22] Filed: Sep. 14, 1981

[30] Foreign Application Priority Data

Sep. 18, 1980 [JP] Japan .............................. 55-130464

[51] Int. Cl.³ ............................................ H03F 3/45
[52] U.S. Cl. ...................................... 330/10; 330/252
[58] Field of Search ...................... 330/9, 10, 51, 252

[56] References Cited

U.S. PATENT DOCUMENTS 3,206,691  9/1965  Martin .................................... 330/9

Primary Examiner—James B. Mullins
Assistant Examiner—G. Wan
Attorney, Agent, or Firm—Cushman, Darby & Cushman

[57] ABSTRACT

In a differential amplifier circuit, there are provided a chopper circuit for converting an input signal into an AC signal intermittently, an amplifier circuit for amplifying the output of the chopper circuit, a sample hold circuit for taking out a signal corresponding to the input signal out of the output of the amplifier circuit and an oscillator circuit for generating a pulse signal for controlling the chopper circuit and the sample hold circuit. The amplifier circuit includes an operational amplifier having an input terminal connected with a grounding resistor to which selected one of the potentials of said two input terminals is applied.

2 Claims, 6 Drawing Figures (a) TERMINAL D (b) TERMINAL E (c) TERMINAL $\bar{E}$ (d) TERMINAL F (e) TERMINAL 45

(f) TERMINAL 46

(g) TERMINAL 47

(h) TERMINAL 48

(i) TERMINAL 43

(a) TERMINAL A (b) TERMINAL B (c) TERMINAL $\bar{B}$ (d) TERMINAL C (e) TERMINAL 125 $\begin{Bmatrix} V_2 \\ (V_2+V_4) \end{Bmatrix}$  $V_2-V_1$ (f) TERMINAL 126 $\begin{Bmatrix} V_2 \\ (V_2+V_4) \end{Bmatrix}$  $(V_2-V_1) \times A_2$ (g) TERMINAL 127 $\begin{Bmatrix} V_2 \\ (V_2+V_4) \end{Bmatrix}$  $(V_2-V_1) \times A_2 \times B_2$ (h) TERMINAL 123 $\begin{Bmatrix} V_2 \\ (V_2+V_4) \end{Bmatrix}$  $\dfrac{(V_2-V_1) \times A_2 \times B_2}{2}$

DIFFERENTIAL AMPLIFIER CIRCUIT

BACKGROUND OF THE INVENTION

This invention relates to a minute signal amplifier circuit such as a bridge amplifier circuit for amplifying the difference between two input signals, or more in particular to a differential amplifier circuit used for electronic devices for automobiles which is operated by a single power supply of a battery carried on the automobile.

The basic circuit of conventional differential amplifier circuits has the construction as shown in FIG. 1. In FIG. 1, reference numerals 1 and 2 designate input terminals, and an input signal is provided by the difference of potential between the two input terminals. Numeral 3 designates an output terminal, and numeral 4 a grounding terminal. An output signal is provided by the difference in potential between the grounding terminal 4 and the output terminal 3. Numerals 11, 12, 13 and 14 designate resistors, numeral 15 an operational amplifier circuit, numeral 16 a battery, numeral 10 a well-known DC-DC converter. The voltage of the battery 16 is applied through the terminals 5 and 6, so that a positive and negative voltages are produced from the terminal 7 and the terminal 9 respectively, thus actuating the operational amplifier 15. The terminal 8 is a power grounding terminal.

The basic circuit of FIG. 1 is a DC amplifier circuit, and in the case of amplification of a minute signal by several hundred times, the drift of the offset voltage of the operational amplifier 15 is also amplified by several hundred times, resulting in an extremely deteriorated amplification accuracy. A high-class operational amplifier has an offset voltage drift less than 1 $\mu v/°$ C. but it is high in cost. In general low-cost operational amplifiers, the drift of the offset voltage is 10 to 50 $\mu v/°$ C.

A circuit system whose differential amplification accuracy is not deteriorated in spite of a low-cost operational amplifier having a large temperature drift of the offset voltage is a chopper system. An example of the chopper system is shown in FIG. 2. An oscillation circuit 110 is for producing a control signal for the chopper and sample holding, and includes a multivibrator (such as CD4047 of RCA) 113, a resistor 112, a capacitor 111 and a NOR gate 114. The multivibrator 113 is connected in such a manner as to act as a non-stable multivibrator, and produces a rectangular pulse signal D of about 8 KHz from the terminal D as shown in FIG. 3(a). On the other hand, a rectangular pulse signal E which is the result of frequency-dividing the pulse signal D by ½ as shown in FIG. 3(b) is produced at the terminal E. Further, a pulse signal $\overline{E}$ obtained by reversing the pulse signal E as shown in FIG. 3(c) is produced at the terminal $\overline{E}$. The NOR gate 114 produces a logic output in response to the pulse signals D and E, and produces a pulse signal F at the output terminal F as shown in FIG. 3(d).

A chopper circuit 60 is comprised of analog switches (such as CD4066 of RCA) 63, 64, 65 and 66 and capacitors 61 and 62. The voltages $V_1$ and $V_2$ applied to the input terminals 41 and 42 respectively are converted into rectangular wave signals and produced at the output terminals 45 and 46 respectively. The control terminals of the analog switches 63 and 64 are supplied with the voltage E of the oscillator circuit 110, and the control terminals of the analog switches 65 and 66 with the voltage $\overline{E}$ of the oscillator circuit 110.

Numeral 110 designates an amplifier circuit, and includes two amplifiers 70 and 80. Numeral 70 designates a differential amplifier circuit including resistors 71, 72, 73 and 74 and an operational amplifier circuit 75 for differentially amplifying the output signal of the chopper circuit 60. Numeral 80 designates an amplifier circuit including a capacitor 81, resistors 82, 83 and 84 and an operational amplifier circuit 85 for inverted amplification of the output signal of the amplifier circuit 70.

Numeral 102 shows a power supply for supplying a voltage to the operational amplifiers 75 and 85. Numeral 51 designates a conductor for connecting the positive terminal of the power supply 102 and the operational amplifiers 75 and 85. Numeral 52 shows a power-grounding conductor for connecting the negative terminal of the power supply 102 and the operational amplifiers 75 and 85. Numeral 53 shows a signal grounding conductor for the amplifier circuits 70 and 80. Numeral 101 designates a well-known constant voltage generator or a constant voltage source such as a battery for increasing the potential of the signal grounding conductor 53 by a predetermined voltage as compared with the potential of the power grounding conductor 52.

Numeral 90 designates a sample hold circuit including an analog switch 91 and a hold capacitor 92 for picking up a signal component corresponding to the input signal (the potential difference between the terminals 41 and 42) from the output signal of the amplifier circuit 80. The output signal of the sample hold circuit 90 is produced in the form of a difference between the potentials at the terminals 43 and 44.

The operation of the circuit having the above-mentioned configuration and the operation waveforms of FIG. 3 will be explained. The terminal 41 is supplied with the voltage $V_1$, and the terminal 42 with the voltage $V_2$. The analog switches 63 and 64 are turned on at level 1 and turned off at level 0 at the timing shown in FIG. 3(c). The analog switches 65 and 66, on the other hand, are turned on at level 1 and turned off at level 0 at the timing shown in FIG. 3(b). At this timing, the rectangular waves chopped as shown in FIGS. 3(e) and 3(f) are produced at the terminals 45 and 46 respectively. Reference character $V_3$ designates the voltage of the voltage source 101.

A waveform obtained by differentially amplifying the waveforms of FIGS. 3(e) and 3(f) is produced at the terminal 47. This waveform, as shown in FIG. 3(g), has an average voltage value of $V_3$ and a crest value of $(V_1-V_2) \times A_1$, where $A_1$ is the amplification factor of the amplifier circuit 70. Though not shown in FIG. 3(g), a DC voltage resulting from multiplying the offset voltage of the operational amplifier 75 by $A_1$ times is applied to the waveform of FIG. 3(g). In order to block this DC voltage, a capacitor 81 is added to the input circuit of the amplifier circuit 80, thus passing the AC components alone.

A waveform shown in FIG. 3(h) is produced at the terminal 48, which waveform has an average value of $V_3$ and a crest value of $(V_2-V_1) \times A_1 \times B_1$, where $B_1$ is the amplification factor of the amplifier circuit 80. The waveform of FIG. 3(h) produced at the terminal 48 is sampled at a predetermined timing by the analog switch 91, held by the capacitor 91, and produced at the terminal 43. As seen from the sampling timing shown in FIG. 3(d), the sampling is taken at level 1. The voltage shown in FIG. 3(i) is produced at the terminal 43. This voltage is higher than the signal grounding voltage $V_3$ by $(V_1 \times V_2) \times A_1 \times B_1/2$. Thus an output signal is produced intermediate the terminals 43 and 44.

In the conventional differential amplifier circuits such as the one shown in FIG. 2, the resistors 71, 72, 73 and 74 of highly accurate resistance value and temperature coefficient are required in order to increase the in-phase signal removal ratio; the capacitance values of the capacitors 61 and 62 are required to coincide with each other with high accuracy in order to prevent an overshoot, delayed rise and ringing in the transient characteristics; it is difficult to regulate the in-phase signal removal ratio since equivalent series resistors of the capacitors 61 and 62 are connected in series with the resistors 71 and 72 respectively; a capacitor low in equivalent series resistor, accurate in capacitance and stable in characteristics is required; the in-phase signal removal ratio is deteriorated by the change with time of the resistors 71, 72 and 73 and the capacitors 61 and 62 in an adverse environment of high temperature, high humidity and considerable vibrations in an automobile engine room, thereby leading to the disadvantage of a high cost and low reliability.

SUMMARY OF THE INVENTION

In view of the above-mentioned disadvantages, it is an object of the present invention to provide a differential amplifier free from the effect of the offset voltage drift of the operational amplifier, in which a great in-phase signal removal ratio is available without adjusting the resistance of the amplifier section and an accurate amplification is possible against variations of the capacitance value of the coupling capacitor or the resistance of the equivalent series resistor.

According to the present invention, there is provided a differential amplifier circuit comprising a chopper circuit for converting an input signal into an AC signal intermittently, an amplifier circuit for amplifying the output of the chopper circuit, a sample hold circuit for taking out a signal corresponding to the input signal out of the output of the amplifier circuit, an oscillator circuit for generating a pulse signal for controlling the chopper circuit and the sample hold circuit, and means for providing a signal grounding potential from a potential at one of two inputs or such a potential increased by addition of a predetermined DC voltage, thus obviating the above-mentioned problems of the conventional devices.

DESCRIPTION OF THE PREFERRED EMBODIMENTS

Figure 1:
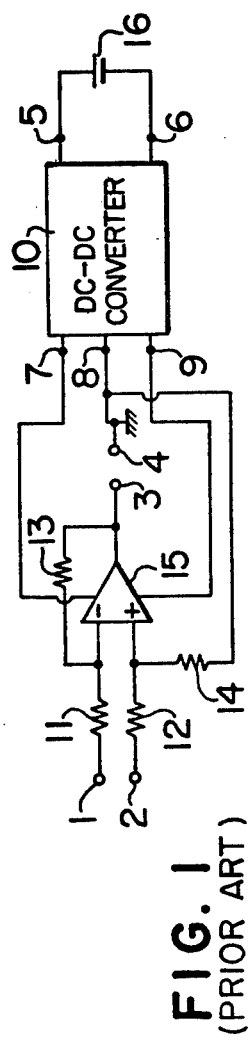
FIG. 1 is a basic circuit of a well-known differential amplifier circuit.
Figure 2:
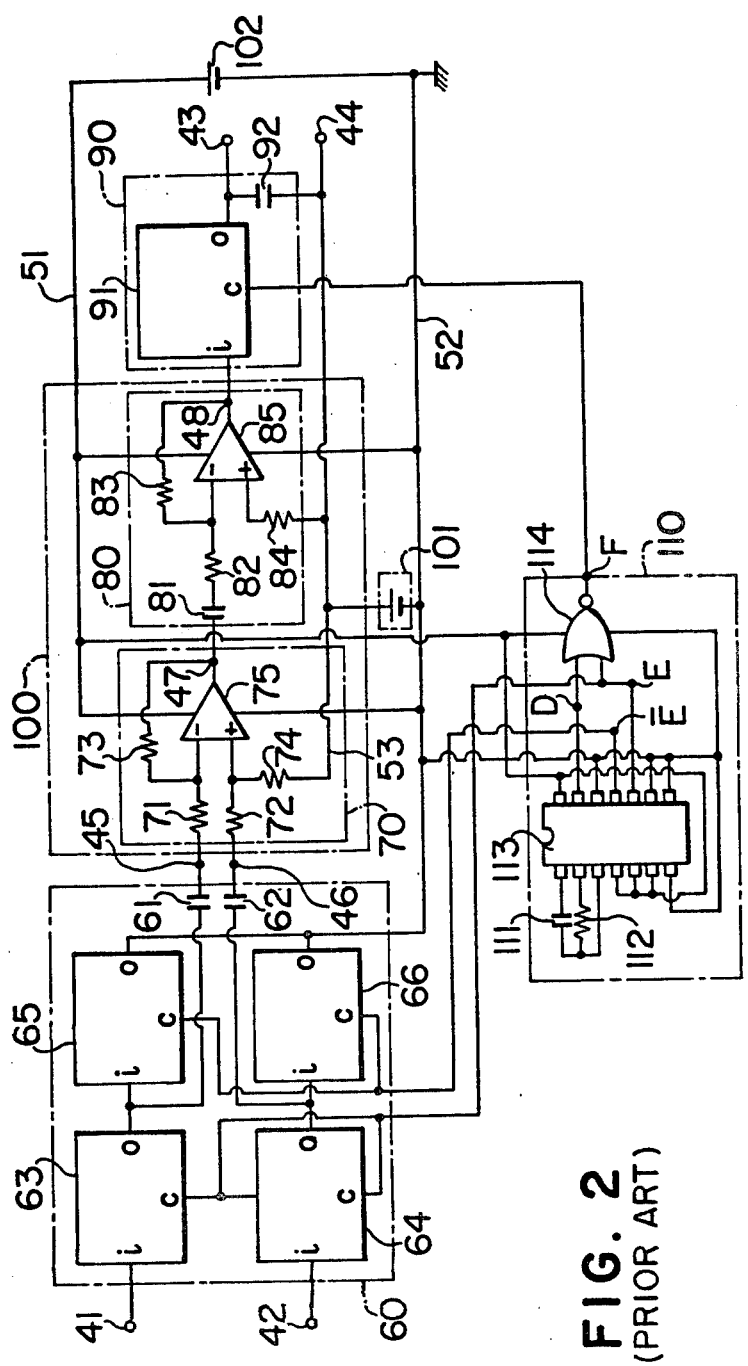
FIG. 2 shows a differential amplifier circuit of a chopper type driven by a single power supply, having a conventional construction.
Figure 3:
FIG. 3 is a time chart showing signals generated at various parts for explaining the operation of the circuit of FIG. 2.
Figure 3:
Figure 3:
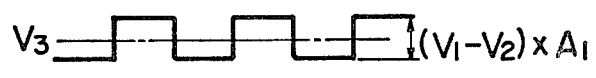
Figure 3:
Figure 3:
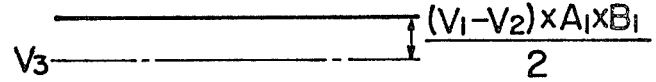
Figure 4:
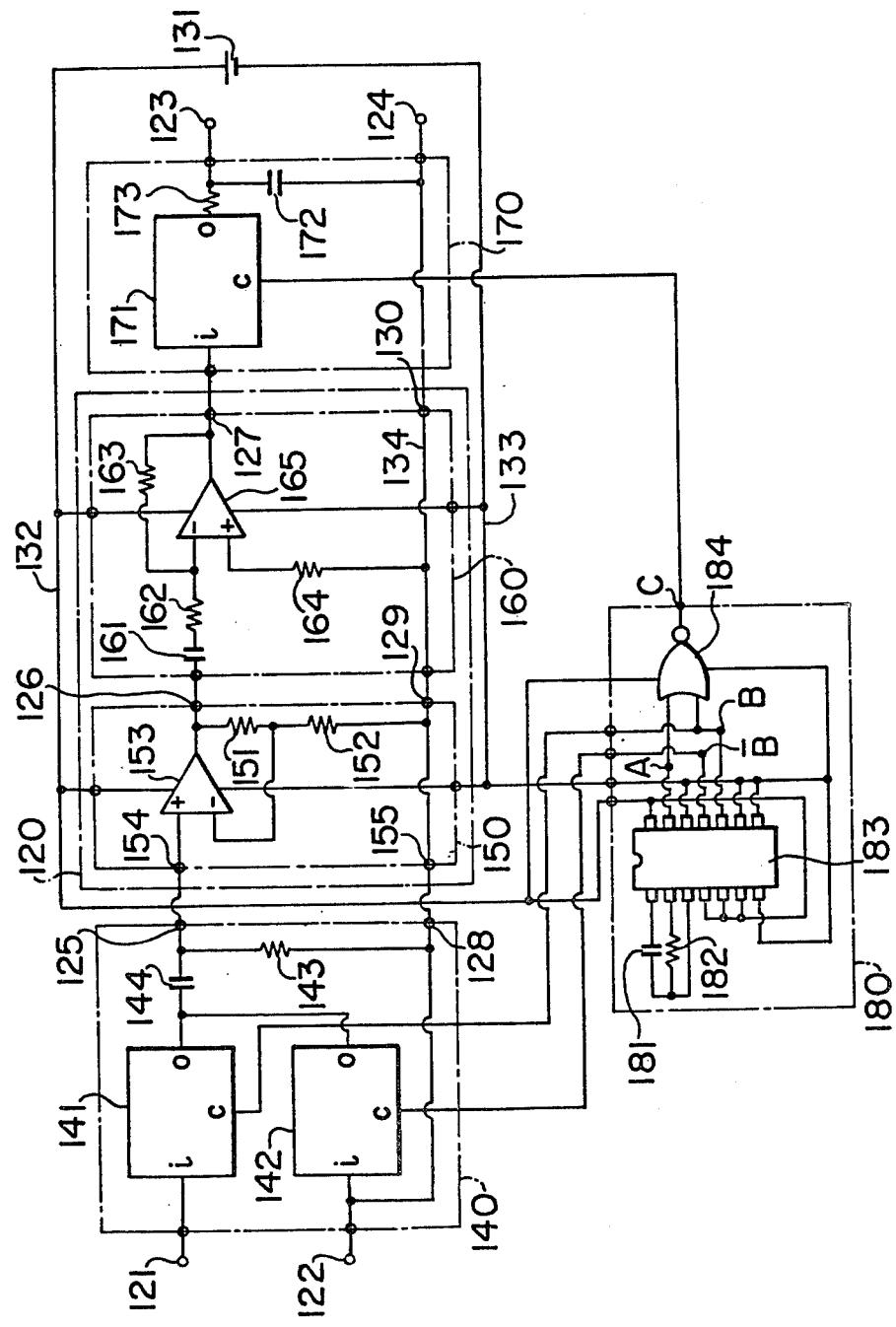
FIG. 4 is an electric circuit diagram of the differential amplifier circuit according to an embodiment of the present invention.

The present invention will be described below with reference to embodiments thereof. In FIG. 4, an oscillator circuit 180 is for obtaining a control signal for the chopper and the sample hold circuit, and is comprised of a multivibrator (such as CD4047 of RCA) 183, a resistor 182, a capacitor 181 and a NOR gate 184.

The multivibrator 183 is connected so as to operate as a non-stable multivibrator, and produces a rectangular pulse signal A of about 8 KHz at the terminal A as shown in FIG. 5(a). Also, this multivibrator 183 produces at the terminal B a rectangular wave pulse signal B by frequency-dividing the pulse signal A by ½ as shown in FIG. 5(b). Further, a pulse signal $\overline{B}$ in an inverted form of the pulse signal B as shown in FIG. 5(c) is produced at the terminal $\overline{B}$.

The NOR gate 184 is impressed with the pulse signals A and B for logic processing, and produces a pulse signal C as shown by FIG. 5(d) from the terminal C.

The chopper circuit 140 includes analog switches (such as CD4066 of RCA) 141 and 142, a capacitor 144 and a resistor 143. The voltages $V_1$ and $V_2$ are applied to the input terminals 121 and 122 respectively, so that the minute potential difference between two input terminals $V_2 - V_1$ is converted into a rectangular wave and produced at the terminal 125. For applying the potential $V_2$ of the input terminal 122 to an end 128 of the resistor 143 as a hypothetical grounding potential, the terminal 128 is connected to the input terminal 122. The control terminals of the analog switches 141 and 142 are supplied with the pulse signals B and $\overline{B}$ of the oscillator circuit 180.

Numeral 120 designates an amplifier circuit, including an amplifiers 150 and 160. The amplifier 150 includes an operational amplifier 153, a feedback resistor 151 and a grounding resistor 152. The hypothetical grounding potential $V_2$ is applied from the terminal 128 to the grounding resistor 152 connected to the negative input terminal of the operational amplifier 153. The output signal from the chopper circuit 140 is amplified by several tens of times at the amplifier circuit 150 and produced at the terminal 126 thereof. This signal takes a rectangular waveform with the crest value of $(V_2 - V_1) \times A_2$ around the center of $V_2$, where $A_2$ is the amplification factor of the amplifier circuit 150.

The amplifier circuit 160 is for further amplifying the output signal of the amplifier circuit 150, and includes an input capacitor 161, an input resistor 162, a feedback resistor 163, a grounding resistor 164 and an operational amplifier 165. The grounding resistor 164 is supplied with the hypothetical grounding potential $V_2$. The amplifier circuit 160 amplifies the output signal of the amplifier circuit 150 by several times in an inverted form, and produces it at the terminal 127. This signal takes a rectangular wave form with the crest value of $(V_2 - V_1) \times A_2 \times B_2$ around the center of $V_2$, where $B_2$ is the amplification factor of the amplifier circuit 160.

The sample hold circuit 170 is for sample holding the output of the amplifier circuit 160, and includes an analog switch 171, a capacitor 172 and a resistor 173. The control terminal of the analog switch 171 is impressed with the output signal of the terminal C of the oscillator circuit 180. When this signal is at level 1, the analog switch 171 is turned on, and when it is at level 0, the analog switch 171 is turned off. In this timing, the output signal of the amplifier circuit 160 is sampled and after being held at the capacitor 172, is produced at the terminal 123. Thus a voltage higher than the hypothetical grounding potential $V_2$ by $(V_2-V_1)\times A_2\times B_2/2$ is produced from the terminal 123. In this way, an output signal corresponding to the input signal is produced in the form of a potential difference between the terminal 123 and the terminal 124 associated with the hypothetical grounding potential $V_2$.

Numeral 131 designates a power supply, numeral 132 a conductor for supplying a positive voltage to each circuit from the positive terminal of the power supply 131, numeral 133 a grounding conductor for supplying a negative voltage to each circuit from the negative terminal of the power supply 131, and numeral 134 is a conductor of the hypothetical earth.

The operation of the circuit having the above construction will be described. Since the analog switches 141 and 142 of the chopper circuit 140 are connected in such a manner as to be turned on and off alternately, a rectangular wave signal having an average value of $V_2$ and a crest value of $V_2-V_1$ is produced at the terminal 125 as shown in FIG. 5(e). The output of the chopper circuit 140 is amplified by the amplifier circuit 150 for producing a signal of the waveform shown in FIG. 5(g) at the terminal 126. This waveform has an average value of $V_2$ and a crest value of $(V_2-V_1)\times A_2$, where $A_2$ is the amplification factor of the amplifier circuit 150. The amplifier circuit 150 has the amplification factor of several tens, and therefore the offset voltage has a proportionately greater error produced at the output terminal. Since a capacitor 161 is inserted in the coupling with the amplifier circuit 160 in the next stage, however, the offset voltage component may be blocked.

The waveform produced at the output terminal 127 of the amplifier circuit 160 is shown in FIG. 5(g). This waveform has an average value of $V_2$ and a crest value of $(v_2-V_1)\times A_2\times B_2$, where $B_2$ is the amplification factor of the amplifier circuit 160. This signal is applied to the sample hold circuit 170. In response to the pulse shown in FIG. 5(d), the analog switch 171 is turned on and off, so that the peak voltage of a waveform shown in FIG. 5(g) is sample held at the capacitor 172 thus producing the voltage signal of FIG. 5(h) at the terminal 123. This output voltage is given as $(V_2-V_1)\times A_2\times B_2/2+V_2$. The potential difference between the terminals 123 and 124 is $(V_2-V_1)\times A_2\times B_2/2$ because the potential at the terminal 124 is $V_2$. This provides a net output signal component.

As described above, by maintaining one of the input terminals at the hypothetical grounding terminal, a low-cost amplification high in accuracy is made possible without any capacitor or resistor of high accuracy.

Figure 6:
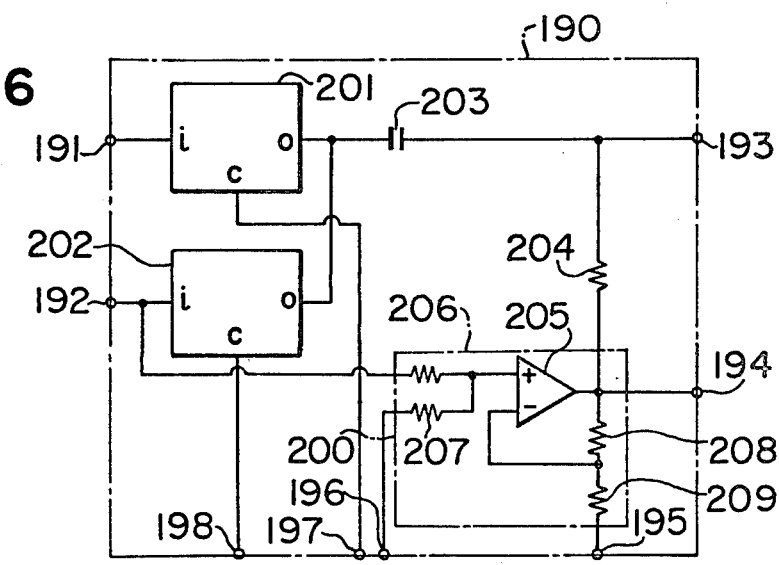
FIG. 6 an electric circuit of the essential parts of the sample hold circuit according to another embodiment of the present invention.

In the above-described embodiment, the chopper circuit 140 is used as a circuit for converting a minute input signal into an alternating current in FIG. 4. In place of the chopper circuit 140, the chopper circuit 190 shown in FIG. 6 may be used with equal effect to achieve the operation of the above-mentioned embodiment.

In this case, the difference lies in the additional provision of an adder circuit 200, an operational amplifier circuit 205, input resistors 206, 207, a feedback resistor 208, a grounding resistor 209, a terminal 196 for supplying a constant voltage, a grounding terminal 195 for connection to the potential of the grounding conductor 133. The constant voltage source connected to the terminal 196 is comprised of a well-known constant voltage source or a battery.

The adder circuit 200 includes an operational amplifier 205, input resistors 206, 207, a grounding resisitor 209 and a feedback resistor 208. A constant voltage $V_4$ at the terminal 196 is added to the voltage $V_2$ at the input terminal 192 thereby to produce the voltage $V_2+V_4$ at the terminal 194. An end 194 of the resistor 204 is supplied with the output voltage of the adder circuit 205 as a hypothetical potential, and therefore the output signal at the terminal 193 takes a rectangular waveform having a crest value $V_2-V_1$ with ther hypothetical potential as a center.

The operation of the circuit having the above-mentioned configuration will be described. The analog switches 201 and 202 of the chopper circuit 190 are connected to be turned on and off alternately, and therefore the capacitor 203 charges and discharges with the potential difference $V_2-V_1$ between the input terminals 191 and 192 at a time constant determined by the resistor 204. Thus a signal of a rectangular waveform having an average value of $V_2+V_3$ and a crest value of $V_2-V_1$ as shown in FIG. 5 (f) is produced at the terminal 193.

The result $V_2+V_3$ of adding the potential $V_2$ at the input terminal 192 to the constant voltage $V_4$ at the terminal 196 is produced from the terminal 194 and used a hypothetical grounding potential. By so doing, the potentials at the input terminal and the output terminal of the operational amplifiers 153 and 165 of the amplifier circuits 150 and 160 in the next stage can be made higher by $V_4$ than in the case of not adding the constant voltage $V_4$. The terminals 193 and 194 of the chopper circuit 190 are connected to the terminals 154 and 155 of the amplifier circuit 150 respectively.

Figure 5:
FIG. 5 is a time chart showing various signals for explaining the operation of the circuit of FIG. 4.
Figure 5:
Figure 5:
Figure 5:
Figure 5:
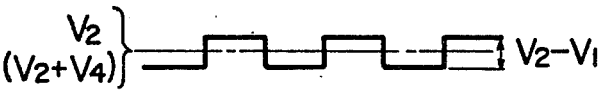
Figure 5:
Figure 5:
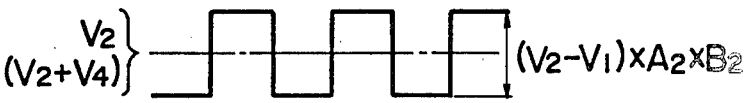
Figure 5:
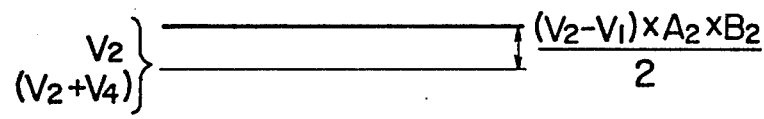

Signals having waveforms shown in FIGS. 5 (f) and 5(g) are produced at the terminal 126 of the amplifier circuit 150 and the terminal 127 of the amplifier circuit 160 respectively. The average value of these signals is $V_2+V_4$. A signal of the waveform shown in FIG. 5 (h) is produced at the terminal 123 of the sample hold circuit 170. The reference level of this signal is $V_2+V_4$.

In this way, the hypothetical grounding potential takes the value $V_2+V_4$, and the voltage $(V_2-V_1)\times A_2\times B_2/2+(V_2+V_4)$ is produced at the output terminal 123. Since the hypothetical grounding potential at the terminal 124 is $V_2+V_4$, the potential difference between the terminals 123 and 124 is $(V_2-V_1)\times A_2\times B_2/2$ which is the same value as in the aforementioned embodiment.

As will be seen from above, the potential obtained by adding a constant voltage to the potential at one of the input terminals is used as a hypothetical grounding potential. Thus even in the case where the allowable voltage range at the input and output terminals of the operational amplifier is limited, the problem may be solved by selecting a proper constant voltage to be added.

It will be understood form the foregoing description that in the differential amplifier circuit according to the present invention, no resistor or capacitor of high accuracy is required and an offset voltage can be blocked by use of low cost parts, thus securing a long-term stability. Further, a minute signal of several mv can be differentially amplified by several hundreds times with high accuracy.

We claim:

1. A differential amplifier circuit for amplifying a potential difference between two input voltage signals applied thereto comprising:
   a d.c. voltage source;
   an oscillator circuit connected to said d.c. voltage source to provide a first and a second control signal;
   a chopper circuit responsive to the first control signal of said oscillator circuit and having a first and a second input terminal for chopping the first input voltage signal applied to the first input terminal and the second input voltage signal applied to the second input terminal so that the chopped two voltage signals are combined with each other to produce an a.c. signal varying between the levels of the first and second voltage signal;
   a ground resistor;
   an operational amplifier circuit having a first and a second input terminal, the first input terminal thereof receiving the a.c. signal from said chopper circuit and the second input terminal thereof receiving through said ground resistor the second input voltage signal from the second input terminal of said chopper circuit; and
   a sample and hold circuit responsive to the second control signal of said oscillator circuit for sampling and holding the output signal of said operational amplifier circuit.

2. A differential amplifier circuit according to claim 1 including a voltage generator circuit for providing a predetermined voltage and wherein said chopper circuit further includes an addition circuit receiving the second input voltage signal from the second input terminal of said chopper circuit and said predetermined voltage signal from said voltage generator circuit to provide an addition signal to the second input terminal of said operational amplifier through said ground resistor.

* * * * *